United States Patent
Roosen et al.

(10) Patent No.: US 6,674,782 B2
(45) Date of Patent: Jan. 6, 2004

(54) SELF-ADAPTING FILTERS FOR FINE-TUNING LASER EMISSIONS

(75) Inventors: Gérald Roosen, Orsay Cedex (FR); Alain Brun, Orsay Cedex (FR); Nicolas Huot, Orsay Cedex (FR); Jean-Michel Jonathan, Orsay Cedex (FR); Gilles Pauliat, Orsay Cedex (FR); Patrick Georges, Orsay Cedex (FR)

(73) Assignee: Centre National de la Recherche Scientifique - CNRS (FR)

( * ) Notice: Subject to any disclaimer, the term of this patent is extended or adjusted under 35 U.S.C. 154(b) by 252 days.

(21) Appl. No.: 09/841,723

(22) Filed: Apr. 25, 2001

(65) Prior Publication Data

US 2002/0006150 A1 Jan. 17, 2002

Related U.S. Application Data

(63) Continuation of application No. PCT/FR99/02644, filed on Oct. 28, 1999.

(30) Foreign Application Priority Data

Oct. 28, 1998  (FR) ............................................. 98 13525

(51) Int. Cl.[7] ............................................. H01S 3/083
(52) U.S. Cl. ............................. 372/94; 372/22; 372/19; 372/66
(58) Field of Search ............................. 372/94, 22, 18, 372/19, 39, 66

(56) References Cited

U.S. PATENT DOCUMENTS

| | | | | |
|---|---|---|---|---|
| 4,765,740 A | * | 8/1988 | Fischer ....................... 356/459 |
| 4,869,579 A | * | 9/1989 | Fischer et al. ............... 359/299 |
| 4,911,537 A | * | 3/1990 | Ewbank ....................... 359/241 |
| 5,037,203 A | * | 8/1991 | Yeh ............................. 356/459 |
| 5,073,705 A | * | 12/1991 | Sharp et al. ................. 250/216 |
| 5,097,478 A | * | 3/1992 | Verdiell et al. ............... 372/94 |
| 5,665,493 A | * | 9/1997 | Bai et al. ....................... 430/1 |
| 6,274,288 B1 | * | 8/2001 | Kewitsch et al. ......... 430/270.14 |
| 6,387,593 B1 | * | 5/2002 | Kewitsch et al. ........... 430/290 |

FOREIGN PATENT DOCUMENTS

EP        0 433 122 A   *   6/1991

OTHER PUBLICATIONS

W.B. Whitten et al., *Mode selection in a continuous–wave dye laser with an intracavity photorefractive element*, Feb. 1987, vol. 12, No. 2, Optics Letters, pp. 117–119.*

M. Cronin–Golomb et al., *Self–induced frequency scanning and distributed Bragg reflection in semiconductor lasers with phase–conjugate feedback*, Jul. 1986, vol. 11, No. 7, Optics Letters, pp. 455–457.*

E. Miltényi et al., *Long–term stable mode locking of a visible diode laser with phase–conjugate feedback*, Apr. 1995, vol. 20, No. 7, Optics Letters, pp. 734–736.*

A. Shiratori et al., *Wavelength–stable, narrow–spectral–width oscillation of an AIGaInP diode laser coupled to a BaTiO₃:Co stimulated photorefractive backscattering phase conjugator*, Sep. 1997, vol. B65, No. 3, Applied Physics, pp. 329–333.*

D. Chomsky et al., *Laser frequency bandwidth narrowing by photorefractive two–beam coupling*, Apr. 1992, vol. 17, No. 7, Optics Letters, pp. 481–483.*

* cited by examiner

*Primary Examiner*—Leon Scott, Jr.
(74) *Attorney, Agent, or Firm*—Piper Rudnick LLP

(57) ABSTRACT

Laser type source of coherent luminous radiation including a resonant cavity, an amplification medium placed in the resonant cavity and a dynamic photosensitive material which is placed in the resonant cavity to form a self-adapting spectral and/or spatial filter, characterized in that the cavity is a ring laser cavity and in that the dynamic photosensitive material is placed at the intersection of two beams.

14 Claims, 5 Drawing Sheets

SELF-ADAPTING FILTERS FOR FINE-TUNING LASER EMISSIONS

RELATED APPLICATION

This is a continuation of International Application No. PCT/FR99/02644, with an international filing date of Oct. 28, 1999, which is based on French Patent Application No. 98/13525, filed Oct. 28, 1998.

FIELD OF THE INVENTION

This invention pertains to a laser type source of coherent luminous radiation, more particularly to the reduction in the number of longitudinal and/or transverse modes (spectral and/or spatial fine-tuning) of such a source.

BACKGROUND

In order to reduce the emission beam width of a laser, there have been proposed in the art selective elements requiring adjustment such as Lyot and Fabry-Perot filters.

Various spectral fine-tuning devices have been published or patented.

Known in the prior art, for example, is EP 284908 describing a device for controlling or regulating an emission wavelength λe and an optical power emitted by a semiconductor laser. The optical power emitted by the laser is transmitted at least in part to an optoelectrical detector device and at least to an optical filtration device that is selective in terms of wavelength. Part of the power transmitted to this filtration device is transmitted to another optoelectrical detector device. According to this state of the art, the semiconductor laser, the filter device and the detectors are integrated on a common substrate. The integrated filter device is constituted by a Bragg grating or by a directional coupler or an interferential filter or by a unit formed by two or more Bragg gratings arranged one behind each other in the direction of transmitted power propagation and/or by directional optical couplers and/or by interferential filters.

There have been proposed in the state of the art wavelength-selective devices located in the laser cavity but which are not self-adapting. The article "82 nm of continuous tunability for an external cavity semiconductor laser" published in Electron. Lett. 27, 183 (1991) describes a fine-tuning and stabilization process for an extended cavity laser diode using a conventional diffraction grating. The diffraction grating is a selective element of the extended cavity. The two factors which contribute to the fine-tuning are the dispersion of the grating and the length of the extended cavity which reduces the Shalow-Townes width of the emitted beam.

Also known are laser diodes of the DFB (distributed feedback) type or DBR (distributed Bragg reflector) type integrating a Bragg grating in the active zone (DFB) or as a cavity mirror (DBR). These Bragg mirrors are not self-adapting.

Various solutions are known in the state of the art for the spectral stabilization of a laser by means of an external cavity. U.S. Pat. No. 4,907,237 describes a process for the stabilization of a laser diode by means of an external cavity that has a particular resonance frequency. A part of the output beam of the external cavity is reinjected into the laser cavity.

Self-adapting external fine-tuning systems have also been proposed in the prior art. The article "Wavelength-stable, narrow-spectral-width oscillation of an AlGaInP diode laser coupled to a $BaTiO_3$:Co stimulated photorefractive backscattering phase conjugator" published in Appl. Phys. B 65, 329(1997) describes a laser employing a phase conjugation mirror using the Bragg selectivity of the gratings by reflection and reinjecting a part of the beam into the laser cavity. The device has a crystal placed outside of the cavity. The phase relation is thus fixed.

Also known is EP 433122 which describes a ring cavity laser device. It involves light injection from a master laser to a slave laser which thereby inherits the coherence properties of the master laser. The presence of the photosensitive material does not modify the spectral properties of the master laser because there is no feedback from the slave cavity to the master cavity.

The article "Laser frequency bandwidth narrowing by photorefractive two-beam coupling" published in Opt. Lett. 17, 481 (1992) describes filtering the bandwidth frequency at the exit of the laser by a photorefractive grating inscribed by the beams exiting from the laser cavity.

The document OPTICS LETTERS, Vol. 12, No. 2, Feb. 1, 1987, pages 117–119, authored by Whitten et al. "Mode selection in a continuous-wave dye laser with an intracavity photoreactive element" describes a source of coherent luminous radiation comprising a linear resonant cavity and an amplifier medium placed in the resonant cavity, as well as a dynamic photosensitive material placed in the resonant cavity to form a self-adapting spectral and/or spatial filter.

The devices of the prior art exhibit various disadvantages. When the characteristics of the cavity vary, for example, due to a change in the length due to thermal variations, the efficacy of the interferential filters proposed in certain devices of the prior art is degraded.

The solutions comprising the use of an external means often require delicate adjustments and are sensitive to mechanical stresses.

SUMMARY OF THE INVENTION

This invention relates to a laser type source of coherent luminous radiation including a resonant cavity, an amplification medium placed in the resonant cavity and a dynamic photosensitive material which is placed in the resonant cavity to form a self-adapting spectral and/or spatial filter, characterized in that the cavity is a ring laser cavity and in that the dynamic photosensitive material is placed at the intersection of two beams.

BRIEF DESCRIPTION OF THE DRAWINGS

Better comprehension of the invention will be obtained from the description below with reference to the attached drawings in which.

DETAILED DESCRIPTION

Figure 1:
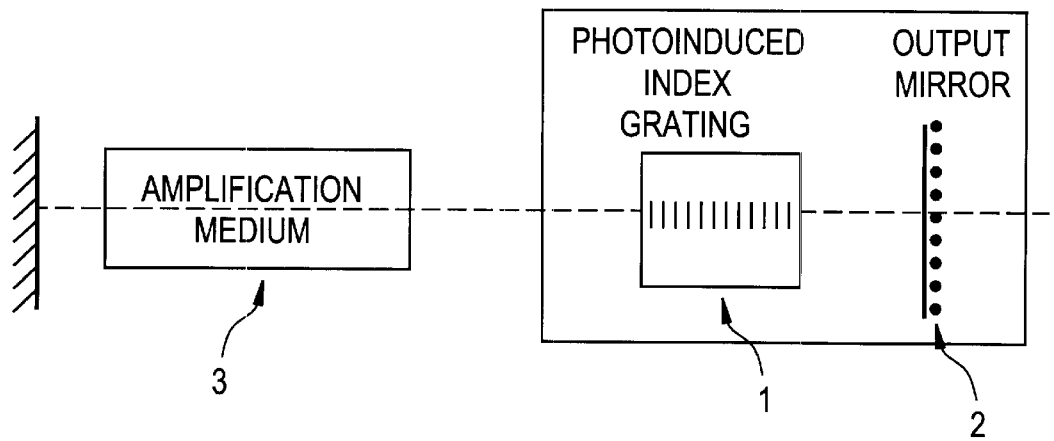
FIG. 1 shows a schematic view of a device of the prior art.

To resolve the disadvantages of the prior art, the invention in its broadest sense pertains to a source of coherent luminous radiation formed by a resonant cavity (laser, optical parametric oscillator, referred to as an "OPO" or the like) comprising an amplifier medium placed inside the cavity, and characterized in that a dynamic photosensitive material forms with the other elements of the cavity a self-adapting spectral and/or spatial filter.

The invention is thus characterized by the incorporation in the source of coherent luminous radiation of an intracavity optical device performing a self-adapting and stable spectral and/or spatial fine-tuning. Such a device makes it possible to select one or more longitudinal or transverse modes existing in the cavity.

The invention is based on the inscription, in the dynamic photosensitive material, of a grating by the wave structure of the cavity. The selectivity of this grating associated with one or more appropriately selected mirrors of the cavity creates an automatically adapted filter and, thus, makes it possible by using intermodal competition to improve the temporal and spatial coherence of the emitted light, while conserving the preexisting wavelength change possibilities.

This filter automatically modulates the losses in a different manner for each of the possible modes of the cavity and the force to oscillate solely on a single mode or a small number of these modes. The adaptation is implemented via the inscription by the beam oscillating in the cavity of a grating or a hologram in a dynamic photosensitive material. It stems from the particular response of the selected dynamic photosensitive material which only responds to the interference gratings (spatial variation of the intensity or the polarization status of the light).

The dynamic photosensitive material is advantageously constituted of a photo-refractive material. These materials are sensitive to the illumination gradient. Other materials, whose variations in index, absorption or anisotropy stem, for example, from a material transfer, are suitable. With this type of response, the writing of a hologram adapted to one mode obliterates the holograms inscribed by the other modes.

According to a preferred variant, the dynamic photosensitive material is sensitive to the spatial variations of the illumination characteristics (intensity or polarization).

According to a particular mode of implementation, the dynamic photosensitive material is formed by a multiplicity of strips and placed in the resonant cavity to form a self-adapting spectral and/or spatial filter.

According to a first mode of implementation, the cavity is a linear cavity and the dynamic photosensitive material is formed by a photorefractive material operating in diffusion regime, oriented to form with the cavity output mirror a Fabry-Perot interferometer which presents a maximum of reflectivity for the mode that inscribed the hologram.

The cavity is advantageously a linear cavity and the dynamic photosensitive material is a suitably placed material of induced transparency.

According to a second mode of implementation, the cavity is a ring laser cavity and the dynamic photosensitive material is placed at the intersection of two crossed beams.

According to an example of implementation, the dynamic photorefractive material is constituted by a barium titanate crystal.

The principal advantages of the invention are the absence of adjustment and the fact that operations are self-adapting.

The invention advantageously avoids use of Fabry-Perot interferometers for fine selection of the wavelength. It is applicable to a large number of lasers, including lasers diodes and microlasers, pulsed as well as continuous at all wavelengths at which one finds dynamic photosensitive materials which are suitable due to their sensitivity, flux performance and other properties required for operation of the device.

The device is made of a dynamic material (1) which is photosensitive at the wavelength used.

The material must be sensitive only to the spatial variations of the characteristics of the illumination figure (intensity, local polarization, etc.) and not to its uniform components to assure selective self-adaptation to a particular mode. This is typically the case in the materials whose variation of index or absorption is principally a function of the rate of modulation $m_i$ of the interference figure to which they are exposed:

$$m_i = \frac{l_i}{l_i + \sum_{i \neq j} l_j}$$

The intensity $I_1$ of the mode i and, thus, the diffraction efficacy of the associated hologram or grating increases with $m_i$. This diminishes the other modulation rates $m_j$ and the diffraction efficacy of the holograms that are associated with them.

The dynamic photosensitive material is the core of the device which reacts such that its self-adaptation to a mode no. i, or to a small number of modes, augments the ratio:

$$R = \frac{\text{losses for any other mode}}{\text{losses for this mode no. 1}}$$

It either diminishes to a greater extent the losses for this mode than for the others or it does not change the losses for this mode and increases them for all of the others.

The diminishment of the losses for this mode and/or the augmentation of the losses for the other modes is defined by the position of this dynamic photosensitive material in the device which is constituted of this photosensitive material and of conventional optical components of cavities such as mirrors.

Various classes of dynamic photosensitive materials can be suitable, for example:

photorefractive materials, materials in which inscription of the hologram results from a redistribution of absorbent centers. One can cite the variation of absorption seen in certain photo-refractive crystals which is linked to the redistribution of electric charges or the variation of absorption and index, which could stem in other materials from a material transfer in the gradient of illumination. These materials can be thin or thick, homogeneous or structured. A large thickness can be advantageously used to reinforce the selectivity of the self-adapting filter. In the case of thin materials, multiple spaced-apart specimens can also reinforce this selectivity.

Depending on the type of inscribed holograms (absorption or index), different devices can be envisaged. Similarly, multiple structures can be implemented depending on the geometry of the cavity (linear, ring-shaped and the like). As examples, the following devices can be cited:

For a photorefractive material used in diffusion regime, the induced hologram is an index hologram which is quadrature in relation to the illumination figure.

A geometry shown in FIG. 1 describes the state of the art with a linear cavity. The device is shown in the rectangle. It is composed of the photorefractive material (1) and the output mirror (2) of the cavity. The grating inscribed in the photorefractive material by the stationary waves of the cavity constitutes a Bragg mirror. Associated with the output mirror (2), it defines a Fabry-Perot filter adapted to the mode which inscribed the grating or hologram. The photorefractive material is placed such that the direction of the interval between the illumination grating and the index grating confers on this Fabry-Perot filter a maximum of reflectivity for the mode that inscribed the hologram. The reflectivity of the device increases for this mode and, thus, the losses decrease and oscillation is promoted. The selectivity introduced is a function of the distance between the material and the mirror, and the thickness of the material.

The mirror is preferably pressed against the amplifier medium, with the unit forming a microlaser.

The material is inserted between the amplifier medium (3) and the output mirror (2). The hologram inscribed by the stationary waves corresponding to one mode of the cavity is a Bragg mirror which reflects partially each of the two counterpropagating waves. In the example described, the holographic material (1) is constituted of a photorefractive barium titanate crystal.

The response of the device, combined with that of a homogeneous beam laser amplifier medium, leads to competition between the modes and forces the laser cavity to oscillate on only one mode or on a small number of modes.

In the case of an inhomogeneous beam laser amplifier medium, the losses induced by the other modes must be sufficiently large to carry these modes below the oscillation threshold of the cavity and thereby fine-tune spectrally and/or spatially the laser emission.

Self-adaptation is implemented by inscription within a suitable dynamic photo-sensitive material of a hologram induced by one or several modes of the laser.

Figure 2:
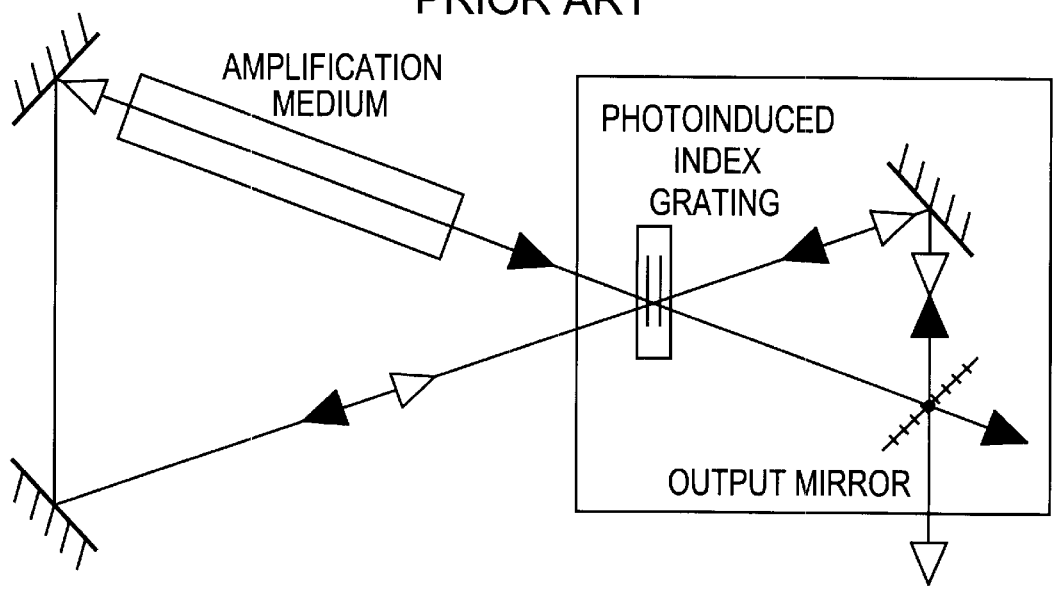
FIG. 2 shows a schematic view of another device of the prior art.

A variant of implementation in which the laser cavity is a ring is illustrated in the diagram of FIG. 2. The device, in the shaded rectangle, is formed of the material and two mirrors, including the output mirror. As in the preceding case, the grating or hologram is inscribed by the interferences which exist in the cavity.

The grating is inscribed by all of the waves that interfere in the photorefractive material. This material is oriented such that the reflectivity of the device augments for the mode that inscribed the hologram. In certain cases, the device can also function as the optical diode (the laser only oscillates in one direction).

For a hologram of induced transparency, the device is constituted by the dynamic photosensitive material and by any one of the mirrors of the cavity. The two counterpropagating beams create a transparency grating which is in phase with the illumination figure, which decreases the losses for this mode. In the steady state, the absorbent centers are preferentially in the dark fringes of the illumination figure of the promoted mode, which in feedback augments the losses for the other modes.

Figure 3:
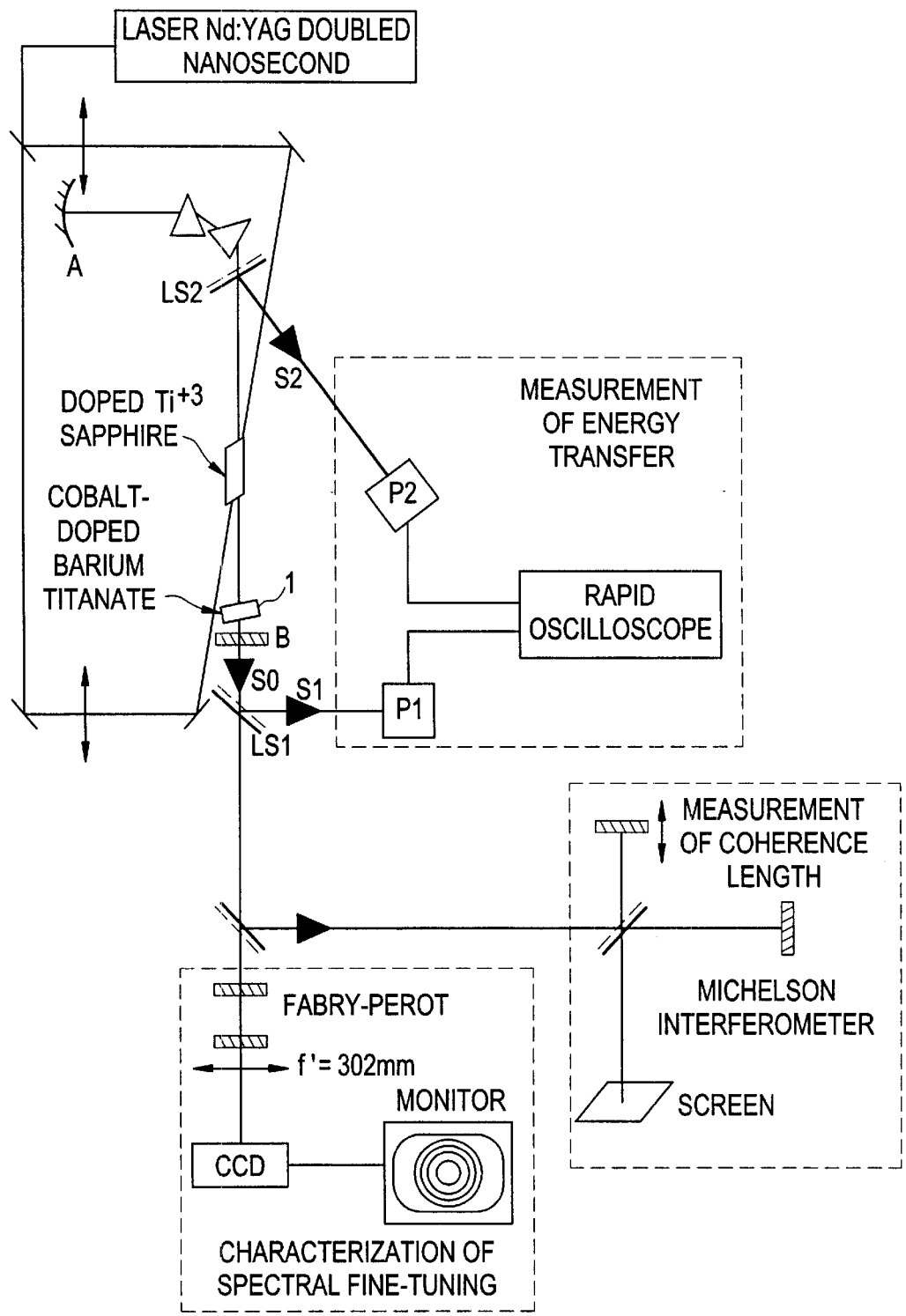
FIG. 3 shows an assembly diagram of an installation comprising a device according to the invention.

FIG. 3 shows an assembly diagram of an installation comprising a device according to the invention and the control systems that enabled verification of its operation. The laser is a titanium-doped sapphire laser pumped at a cadence of about 10 Hz by a Nd:YAG nanosecond laser doubled in frequency. It emits pulse of a duration of about 50 ns in gain-triggered regime. It is tuned by two adjustable prisms. There is no Fabry-Perot filter in the cavity such that the spectrum obtained spreads out over approximately 0.7 nm. The homogeneity of the beam enables competition between the modes. The commercially available laser cavity has a length of 60 cm. The output mirror (mirror B) has a coefficient of reflection of about 60% and transmits the output SO.

The dynamic photosensitive material (1) was placed at a distance that could vary from about 1 mm to several centimeters from the output mirror (B) due to the space available in this particular laser. The mirror (B) could also have been positioned on the crystal according to a variant of implementation. Because of the emission wavelength of this laser, there was selected from among the available materials a cobalt-doped barium titanate photorefractive crystal, cut at 45° to the optical axis, having an absorption on the order of about 0.2 $cm^{-1}$ toward about 750 nm with a thickness of about 2 mm. This made it possible to put aside the problems of optical damage while profiting from the maximum gain of the titanium-doped sapphire laser crystal (around 780 nm). This defined the operating wavelength of about 760 nm.

Three systems were employed to test the operation of the device according to the invention:

a glass strip LS2 placed in front of the prisms extracts a part of the intracavity beam (output S2). A second strip LS1 extracts a part of the output beam S0 (signal S1). Two rapid photodiodes P1 and P2 on the outputs S1 and S2 make it possible to observe the accumulation of energy in the laser cavity resulting from the augmentation of reflectivity due to the self-adapting filter;

a plane Fabry-Perot interferometer makes it possible to visualize the multiple interference rings and, thus, to observe the spectral fine-tuning of the laser;

a Michelson interferometer makes it possible to evaluate the length of coherence of the laser source.

Figure 4:
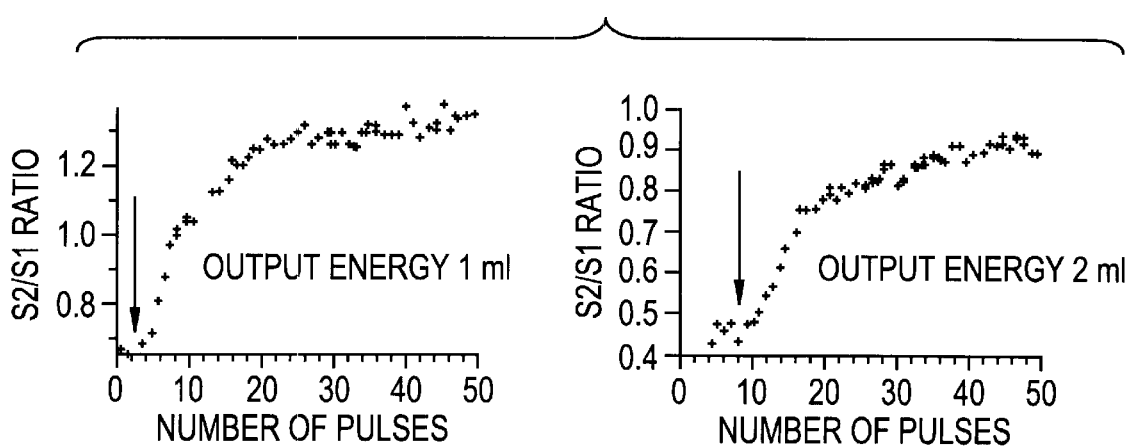
FIGS. 4a–4c are three graphs showing evolution of the ratio between the intracavity energy and the output energy of the laser in relation to time for different steady state output energies.
Figure 4:
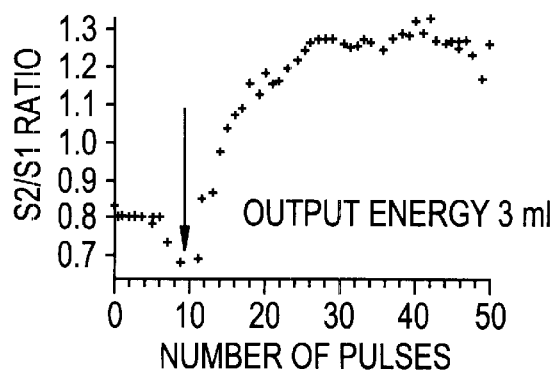

The accumulation of energy in the laser cavity is assessed by measuring the evolution of the ratio of the energies measured at S2 and S1. On the first pulses emitted by the laser, FIG. 4 shows the desired augmentation in the ratio of the energies. Nevertheless, this could be attributed to the establishment of thermal equilibrium in the laser medium. In order to be certain that this thermal equilibrium has been reached, one waits several seconds then rapidly modifies the emission wavelength of the laser by slightly turning the cavity base mirror A. The previously inscribed grating is ineffective because it is no longer adapted to the laser's new operating mode. A progressive transfer of energy is established from S1 to S2 as a new grating is created and the previous one obliterated. The experiment also demonstrates that the tunability of the laser is preserved. The experiment was reproduced for steady state output energies of 1 mJ, 2 mJ and 3 mJ. In FIG. 4, the arrows show the moments at which the laser wavelength was varied.

An increase in the S2/S1 ratio can be seen on the three curves. The ratios were equal to 1.96, 2 and 1.86, respectively, for the different steady state output energies. Elimination of the thermal effects as responsible implies that the component is effective and reflectivity of the component increases with time to reach a steady state. Based on this variation of the ratio between the initial state and the steady state, it can be shown that under these conditions and at the Bragg tuned wavelength, the reflectivity of the component advanced from about 60% to about 75% and that the photoinduced grating has a reflectivity of about 7.5% at the steady state. In accordance with the time to write a photorefractive grating for an energy on the crystal on the order of about 7 mJ and for a beam diameter on the order of about 2 mm, the effect is established in about ten pulses.

Figure 5:
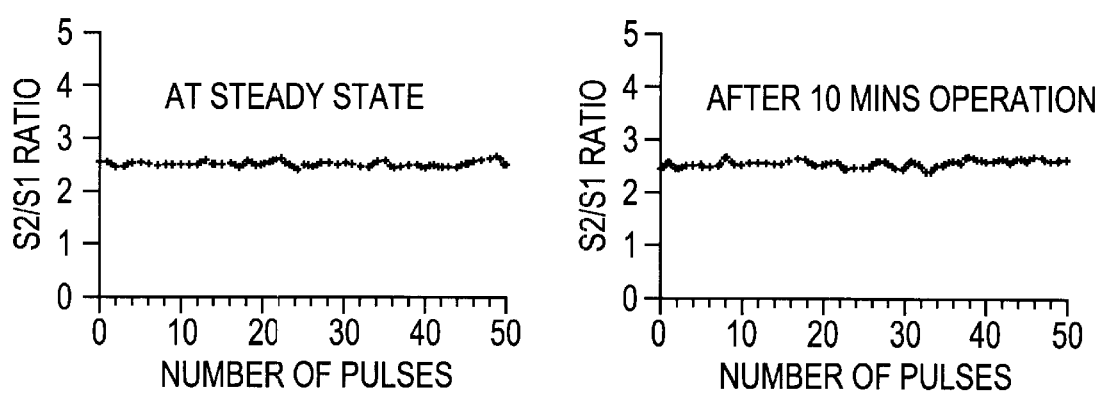
FIGS. 5a and 5b are two graphs showing the energy stability curve of the S2/S1 ratio over time, at the steady state (curve at left) and after operating for 10 minutes (curve at right)

The energy stability of the efficacy of the component was verified by recording on 50 pulses the S2/S1 ratio after the steady state was reached. The measurement was recommenced after 10 minutes of operation. It can be seen in FIG. 5 that the S2/S1 ratio was unchanged at ±3%.

Figure 6:
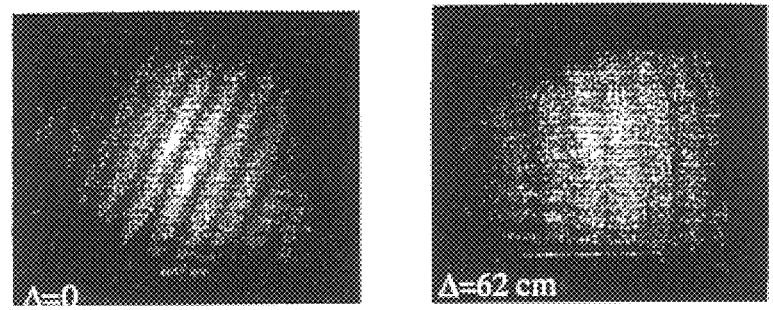
FIGS. 6a and 6b show air wedge fringes for two path length differences.

A Michelson interferometer, shown in FIG. 3 and whose difference in path length Δ between the two arms was varied, makes it possible to verify that this transfer of energy is accompanied by an augmentation of the length of coherence of the source. Without photorefractive crystal in the laser cavity, it is on the order of about 1 mm, in agreement with a spectral width on the order of about 0.7 nm. When the photorefractive crystal was placed in the laser cavity at a distance of about 1 mm from the output mirror, a length of coherence greater than about 60 cm was measured. The interferograms corresponding to operation with the photorefractive crystal and for path length differences equal to Δ=0 and Δ=62 cm are shown in FIG. 6. If the path length difference Δ of the Michelson interferometer is set to be greatly higher than mm, and if the emission wavelength of the laser is changed slightly, the fringes of the interferogram (air wedge fringes) disappear (the device photoinduced grating plus output mirror is maladapted). They reappear in about 1 to about 2 seconds (a new adapted photoinduced grating is constructed). The kinetics of this process is coherent with the previously measured energy accumulation time constants. This measurement makes it possible to affirm that the laser beam width was reduced from about 300 GHz to less than about 1 GHz.

Figure 7:
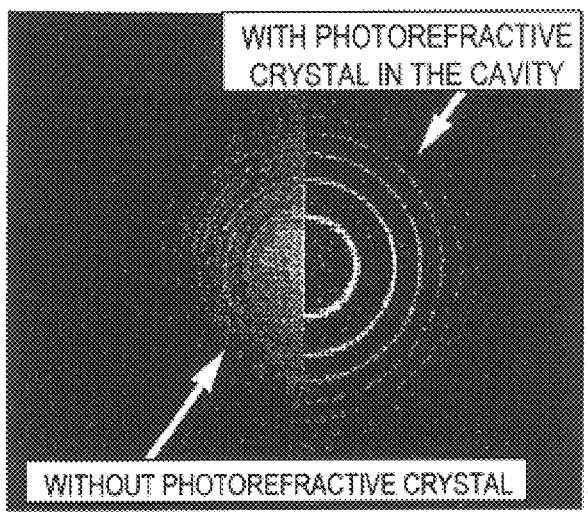
FIG. 7 shows interferograms obtained with and without a photorefractive crystal.

The spectral fine-tuning can be observed using a plane Fabry-Perot interferometer with a thickness of about 3 mm (free spectral interval of about 50 GHz) and the spectral fine-tuning is visualized by a decrease in the number of rings. They are juxtaposed on the same image (FIG. 7), at the left the interferogram obtained without photorefractive crystal in the laser cavity and at the right the interferogram obtained when the photorefractive crystal is placed about 1 mm from the output mirror.

The spectral fine-tuning is clearly demonstrated. This result confirms that the beam obtained has a width on the order of GHz.

Figure 8:
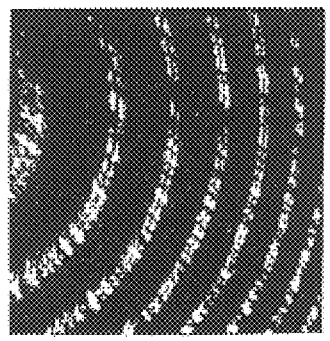
FIG. 8 shows an interferogram demonstrating the bimodal functioning of the laser.

For a resolution of less than about 1 GHz capable of resolving the structure of these rings, the mirrors of the Fabry-Perot were spaced apart up to about 6.6 cm (free spectral interval of about 2.5 GHz). For a distance d between the photorefractive crystal and the rear mirror between about 1 mm and about 8 cm, a longitudinal bimodal behavior was observed. FIG. 8 shows the interferogram obtained with the Fabry-Perot interferometer at about 6.6 cm for a distance d=4 cm and illustrates the bimodal operation of the laser.

As expected, the proposed invention reduces the spectral width of the laser. In addition, it does not require fine adjustment. All that is required is to simply approximately place the photorefractive crystal to augment the reflectivity of the crystal output mirror unit.

The device according to the invention has a fineness comparable to that of the usual adjustable devices but, in addition, has self-adapting properties which make it noteworthy. The value of the device is great for wavelength-tunable sources. The adjustment of the wavelength by the usual devices (Lyot filter, gratings, prisms, etc.) can be implemented according to the invention. The beam width is automatically reduced by the device no matter what wavelength is selected. For this to take place, it is sufficient that the material be photosensitive over a sufficiently broad range of wavelengths.

Without intracavity element other than the amplifier medium itself, the laser emission is generally multimodal. Use is made of Fabry-Perot interferometers coupled to birefringent filters or to prisms to spectrally fine-tune the laser emission. These devices are complicated to use and are not self-adapting.

For spectroscopy studies, it is necessary to have available a spectral width range smaller than the width of the energy level studied. It is for this reason that the tunable laser sources are offered with a spectral fine-tuning option. Such a spectral reduction can be implemented by means of the invention.

For studies requiring a large coherence length (interferometry) or a small spectral width (velocimetry), it is necessary to fine-tune the emission beam of the laser employed, which is generally fixed but too broad. For example, in the case of pulsed Nd:YAG lasers, one uses a second monomodal continuous Nd:YAG laser, referred to as the master laser, which functions as an injector to the pulsed laser, which is referred to as the slave laser to force the emission of the slave laser to be monomodal. The invention presented here can advantageously replace this solution which is otherwise complex and costly to implement.

This is a particularly sensitive problem in the case of OPOs. In fact, their emission beam has a spectral bandwidth which is several nanometers in width, particularly when they are not injected and especially when they operate in the vicinity of degeneration. In fact, in this case, the phase tuning condition is broad. Such sources would benefit by being fine-tuned. Spectral fine-tuning is generally obtained by means of diffraction gratings which can be replaced by the self-adapting spectral filter.

Figure 9:
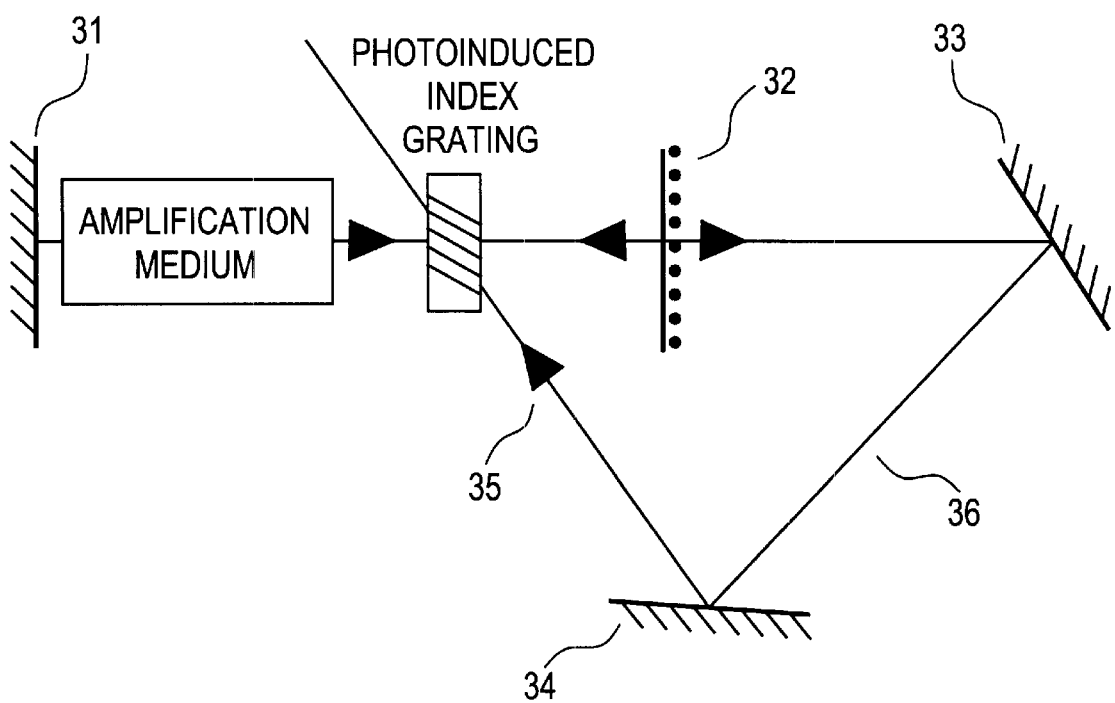
FIG. 9 is a schematic view of another embodiment of the invention.

A third possible geometry is shown in FIG. 9. The resonant cavity is constituted of the mirror 31 and the coupler 22. The mirrors 33 and 34, located outside of this cavity, enable transmission of the emitted beam onto the photorefractive crystal. This beam interferes with the beams present in the resonant cavity so as to inscribe a hologram. This hologram reinjects the light from the beam 35 into the principal cavity. Advantageously, a spatial or spectral filter can be inserted in the cavity formed by the mirrors and the photorefractive material so as to provide supplementary filtering or a selection of the wavelength or the spatial mode.

It is also possible to transform multimodal microlasers into monomodal microlasers, including those of the invention.

Finally, the invention can be used to improve the spatial qualities of power laser diodes by reducing their spectral bandwidth.

The applications pertain especially to the field of telecommunications for emission in continuous regime for the implementation of a monomodal source avoiding modal jumps.

What is claimed is:

1. A laser type source for coherent luminous radiation comprising:
   a resonant laser cavity disposed between at least a reflective mirror and an output mirror to resonate coherent luminous radiation therebetween,
   an amplification medium placed in the resonant cavity, and
   a self-adapting filter placed within the resonant cavity between the amplification medium and the output mirror comprising a multiplicity of strips of a dynamic photosensitive material, said multiplicity of strips being positioned so that the resonating coherent luminous radiation redistributes absorbent centers in the dynamic photosensitive material, thereby generating an interference pattern that selectively filters modes of the resonating coherent luminous radiation.

2. The laser type source of coherent luminous radiation according to claim 1, wherein the dynamic photosensitive material is sensitive to the spatial variations of the illumination characteristics including intensity or polarization.

3. The laser type source of coherent luminous radiation according to claim 1, wherein the dynamic photosensitive material is a homogeneous material.

4. The laser type source of coherent luminous radiation according to claim 1, the dynamic photosensitive material comprises a photorefractive material.

5. The laser type source of coherent luminous radiation according to claim 1, wherein the cavity is a ring laser cavity and the dynamic photosensitive material is a photorefractive material.

6. The laser type source of coherent luminous radiation according to claim 1, wherein the dynamic photosensitive material is a material of induced transparency.

7. The laser type source of coherent luminous radiation according to claim 1, wherein the dynamic photosensitive material is constituted by a photorefractive crystal of barium titanate.

8. A laser source apparatus comprising:
   means forming a resonant laser cavity;
   an amplification medium placed in the resonant cavity; and
   a self-adapting filter located within the resonant cavity,
   wherein the cavity is a ring laser cavity disposed between at least a reflective mirror and an output mirror to resonate coherent luminous radiation therebetween, and the self-adapting filter comprises a multiplicity of strips of a dynamic photosensitive material placed proximal an intersection of two beams of the coherent luminous radiation generated by the apparatus, said multiplicity of strips being positioned so that the resonating coherent luminous radiation redistributes absorbent centers in the dynamic photosensitive material, thereby generating an interference pattern that selectively filters modes of the resonating coherent luminous radiation.

9. The apparatus according to claim 8, wherein the dynamic photosensitive material is sensitive to spatial variations of illumination characteristics.

10. The apparatus according to claim 8, wherein the dynamic photosensitive material is a homogeneous material.

11. The apparatus according to claim 8, wherein the dynamic photosensitive material is a photorefractive material.

12. The apparatus according to claim 8, wherein the dynamic photosensitive material is a material of induced transparency.

13. The apparatus according to claim 8, wherein the dynamic photosensitive material is a photorefractive crystal of barium titanate.

14. A self-adapting filter for fine-tuning laser emissions comprising:
    means forming a resonant laser cavity;
    an amplification medium placed in the resonant cavity; and
    a multiplicity of strips of a dynamic photosensitive material located in the resonant cavity between at least a reflective mirror and an output mirror which forms the filter,
    wherein the cavity is a ring laser cavity disposed between said reflective mirror and said output mirror to resonate the coherent luminous radiation therebetween and the multiplicity of strips is placed proximal an intersection of two beams of the coherent luminous radiation generated by a laser generator and positioned so that the resonating coherent luminous radiation redistributes absorbent centers in the dynamic photosensitive material, thereby generating an interference pattern that selectively filters modes of the resonating coherent luminous radiation.

* * * * *